United States Patent
Tsai et al.

(10) Patent No.: US 8,715,802 B2
(45) Date of Patent: May 6, 2014

(54) TRANSFERRING STRUCTURE FOR FLEXIBLE ELECTRONIC DEVICE AND METHOD FOR FABRICATING FLEXIBLE ELECTRONIC DEVICE

(75) Inventors: Pao-Ming Tsai, Kaohsiung (TW); Liang-You Jiang, Taipei County (TW); Yu-Yang Chang, Hsinchu County (TW); Hung-Yuan Li, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 662 days.

(21) Appl. No.: 12/488,444

(22) Filed: Jun. 19, 2009

(65) Prior Publication Data
US 2010/0203296 A1  Aug. 12, 2010

(30) Foreign Application Priority Data
Feb. 10, 2009  (TW) .............................. 98104140 A

(51) Int. Cl.
| | | |
|---|---|---|
| *B32B 7/00* | (2006.01) | |
| *B32B 3/10* | (2006.01) | |
| *B32B 7/04* | (2006.01) | |
| *B32B 7/06* | (2006.01) | |
| *B32B 7/12* | (2006.01) | |
| *B32B 37/12* | (2006.01) | |
| *B32B 38/00* | (2006.01) | |
| *B32B 38/04* | (2006.01) | |
| *B32B 38/10* | (2006.01) | |
| *B32B 38/12* | (2006.01) | |
| *H01L 21/70* | (2006.01) | |
| *H01L 21/77* | (2006.01) | |

(52) U.S. Cl.
USPC ....... 428/41.8; 428/40.1; 428/42.2; 428/42.3; 428/172; 428/189; 428/212; 438/110; 438/113; 438/462; 438/464; 156/247; 156/248; 156/289; 156/701; 156/706; 156/708; 156/719; 427/207.1; 427/258; 427/261; 427/265; 427/266; 427/270; 427/407.1; 427/457; 257/E21.598; 257/E21.705

(58) Field of Classification Search
None
See application file for complete search history.

(56) References Cited

U.S. PATENT DOCUMENTS

| | | | |
|---|---|---|---|
| 5,825,526 A | | 10/1998 | Bommarito et al. |
| 5,972,152 A | * | 10/1999 | Lake et al. .................... 156/247 |

(Continued)

FOREIGN PATENT DOCUMENTS

| | | |
|---|---|---|
| CA | 2015307 | 10/1990 |
| EP | 0498043 | 8/1992 |

(Continued)

OTHER PUBLICATIONS

Machine Translation of JP 2006080212 A, Mar. 2006.*

(Continued)

*Primary Examiner* — Aaron Austin
*Assistant Examiner* — Jeff Vonch

(57) ABSTRACT

The invention provides a transferring apparatus for a flexible electronic device and method for fabricating a flexible electronic device. The transferring apparatus for the flexible electronic device includes a carrier substrate. A release layer is disposed on the carrier substrate. An adhesion layer is disposed on a portion of the carrier substrate, surrounding the release layer and adjacent to a sidewall of the release layer. A flexible electronic device is disposed on the release layer and the adhesion layer, wherein the flexible electronic device includes a flexible substrate.

24 Claims, 21 Drawing Sheets

(56) References Cited

U.S. PATENT DOCUMENTS

| | | | |
|---|---|---|---|
| 6,027,958 A * | 2/2000 | Vu et al. | 438/110 |
| 6,146,480 A * | 11/2000 | Centanni et al. | 156/151 |
| 6,488,994 B1 | 12/2002 | Haller et al. | |
| 6,572,780 B2 * | 6/2003 | McCormack et al. | 216/13 |
| 6,762,510 B2 | 7/2004 | Fock et al. | |
| 6,887,650 B2 * | 5/2005 | Shimoda et al. | 430/311 |
| 7,807,551 B2 | 10/2010 | Huang et al. | |
| 7,820,529 B2 * | 10/2010 | Tsurume et al. | 438/464 |
| 2003/0032210 A1 * | 2/2003 | Takayama et al. | 438/30 |
| 2003/0219969 A1 * | 11/2003 | Saito et al. | 438/622 |
| 2003/0223138 A1 * | 12/2003 | Akiyama | 359/883 |
| 2005/0208736 A1 * | 9/2005 | Matsumura et al. | 438/460 |
| 2006/0112543 A1 * | 6/2006 | Ishikawa et al. | 29/830 |
| 2006/0180815 A1 | 8/2006 | Sarma et al. | |
| 2006/0216861 A1 * | 9/2006 | Nakagawa | 438/113 |
| 2007/0059854 A1 | 3/2007 | Huang et al. | |
| 2007/0065993 A1 * | 3/2007 | Wong et al. | 438/149 |
| 2007/0091062 A1 | 4/2007 | French et al. | |
| 2007/0145602 A1 * | 6/2007 | Yang | 257/777 |
| 2007/0241078 A1 * | 10/2007 | Pratt et al. | 216/13 |
| 2008/0099134 A1 * | 5/2008 | Tadakuma | 156/250 |
| 2008/0315440 A1 * | 12/2008 | Dekker et al. | 257/787 |
| 2011/0027551 A1 * | 2/2011 | Huang et al. | 428/212 |
| 2012/0052214 A1 * | 3/2012 | Tsai et al. | 427/558 |
| 2012/0164408 A1 * | 6/2012 | Hwu et al. | 428/202 |

FOREIGN PATENT DOCUMENTS

| | | | |
|---|---|---|---|
| GB | 2030779 A * | 4/1980 | |
| JP | 6214220 | 8/1994 | |
| JP | 2001127410 A * | 5/2001 | |
| JP | 2001210998 A * | 8/2001 | |
| JP | 2001233968 | 8/2001 | |
| JP | 2003273483 A * | 9/2003 | |
| JP | 2004087701 A * | 3/2004 | H01L 23/12 |
| JP | 2005294578 A * | 10/2005 | |
| JP | 2006080212 A * | 3/2006 | |
| JP | 2006140323 A * | 6/2006 | |
| JP | 2006269994 | 10/2006 | |
| JP | 2009099834 | 5/2009 | |
| KR | 20020032951 | 5/2002 | |
| TW | 595276 | 6/2004 | |
| TW | I220882 | 9/2004 | |
| TW | 1287298 | 9/2007 | |
| TW | 200806073 | 1/2008 | |
| TW | 200839359 | 10/2008 | |
| TW | 200847229 | 12/2008 | |
| TW | I321241 | 3/2010 | |
| WO | WO 03069593 | 8/2003 | |
| WO | WO 2009051071 A1 * | 4/2009 | |

OTHER PUBLICATIONS

Machine Translation of JP 2004087701 A, Mar. 2004.*
Machine Translation of JP 2001127410 A, May 2001.*
Machine Translation of JP 2009-099834 A (equivalent to WO 2009051071 A1), Apr. 2009.*
China Patent Office, Office Action, Patent Application U.S. Appl. No. 200910127232.2, Apr. 5, 2012, China.
Taiwan Patent Office, Office Action, Patent Application Serial No. 094131598, Aug. 28, 2009, Taiwan.
US Patent Office, Office Action, U.S. Appl. No. 11/164,408, May 7, 2008, US.
US Patent Office, Office Action, U.S. Appl. No. 11/164,408, Nov. 20, 2008, US.
China Patent Office, Office Action, Patent Application Serial No. 200910127232.2, Nov. 5, 2012, China.
Taiwan Patent Office, Office Action, Patent Application Serial No. 098104140, Mar. 29, 2013, Taiwan.

* cited by examiner

TRANSFERRING STRUCTURE FOR FLEXIBLE ELECTRONIC DEVICE AND METHOD FOR FABRICATING FLEXIBLE ELECTRONIC DEVICE

CROSS REFERENCE TO RELATED APPLICATIONS

This Application claims priority of Taiwan Patent Application No. 098104140, filed on Feb. 10, 2009, the entirety of which is incorporated by reference herein.

BACKGROUND OF THE INVENTION

1. Field of the Invention

The present invention relates to a transferring apparatus for a flexible electronic device and method for fabricating a flexible electronic device, and in particular, to a method for debonding a flexible substrate of a flexible electronic device.

2. Description of the Related Art

Flexible displays are popularly applied to portable electronic products due to their sturdiness, light weights, and thin structures. Additionally, flexible displays provide designers with greater degrees of freedom for designing of different shapes or curvatures.

During fabrication of flexible displays, positioning and flat disposition of the flexible substrates is important for higher quality thereof. For fabricating flexible display panels, a plurality of panels is defined on a large-sized substrate. However, a drawback of the conventional fabricating process results in distortion of the flexible substrates cut therefrom, and misalignment of circuits on the flexible substrate when bonding to a flexible printed circuit (FPC) board. Specifically, a peeling problem occurs between the flexible substrates and the glass carrier.

FIG. 1a shows a conventional flexible thin film transistor (TFT) substrate 5 disclosed in TW. Pat. No. 200806073. A 20 μm organic release film 511 is deposited on a glass carrier 6, wherein the release film 511 can be directly separated from the glass carrier 6. Next, an inorganic film 513 and an organic film 514 are formed on the release film 511. An amorphous silicon or polysilicon TFTs 52 is then formed on the organic film 514. Next, the release film 511 with TFTs 52 thereon is separated from the glass carrier 6. A flexible TFT substrate 5 is fabricated. However, the deposition time of the release film 511 is too long to be used in the fabrication processes.

FIG. 1b shows a conventional display disclosed in U.S. Pat. No. 2007/0091062. A plastic substrate 120 can be separated from glass carrier 122 by gasifying a α-Si release layer 124 using a laser beam 126 to scan the entire forming region of the α-Si release layer 124. However, a slow throughput problem occurs because the scanning time increases according to increased area of the plastic substrate 120. Additionally, when the laser beam 126 scans the α-Si release layer 124, the laser beam 126 may pass through the plastic substrate 120 to destroy components thereon, thereby causing a low fabrication yields.

BRIEF SUMMARY OF INVENTION

To solve the above-described problems, a transferring apparatus for a flexible electronic device and a method for fabricating a flexible electronic device are provided. An exemplary embodiment of a transferring apparatus for a flexible electronic device comprises a carrier substrate. A release layer is disposed on the carrier substrate. An adhesion layer is disposed on a portion of the carrier substrate, surrounding the release layer and adjacent to a sidewall of the release layer. A flexible electronic device is disposed on the release layer and the adhesion layer, wherein the flexible electronic device includes a flexible substrate.

An exemplary embodiment of method for fabricating a flexible electronic device is provided, comprising a carrier substrate. A release layer is formed on the carrier substrate. An adhesion layer is formed on a portion of the carrier substrate, surrounding the release layer and adjacent to a sidewall of the release layer. A flexible substrate is formed on the release layer and the adhesion layer. A flexible electronic component is formed on the flexible substrate. A debonding step is performed so that the flexible substrate is separated from the carrier substrate.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
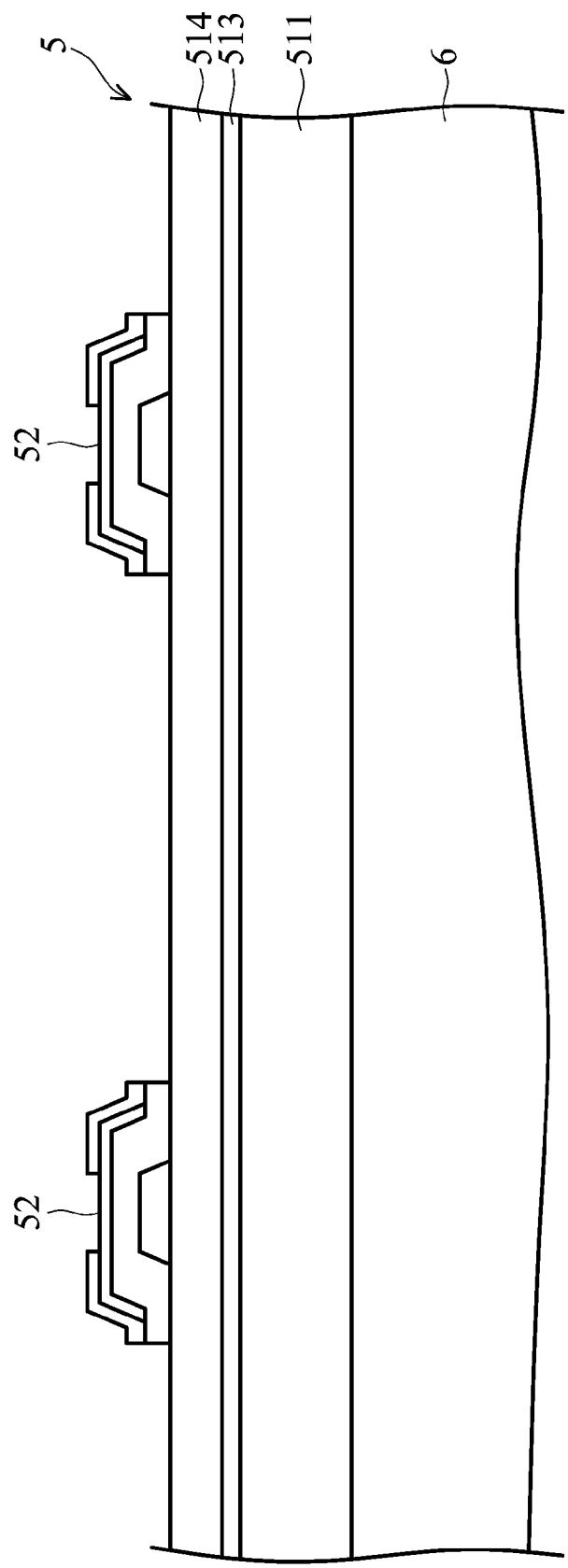
FIGS. 1a and 1b show a method for fabricating a conventional flexible electronic device.
Figure 1B:
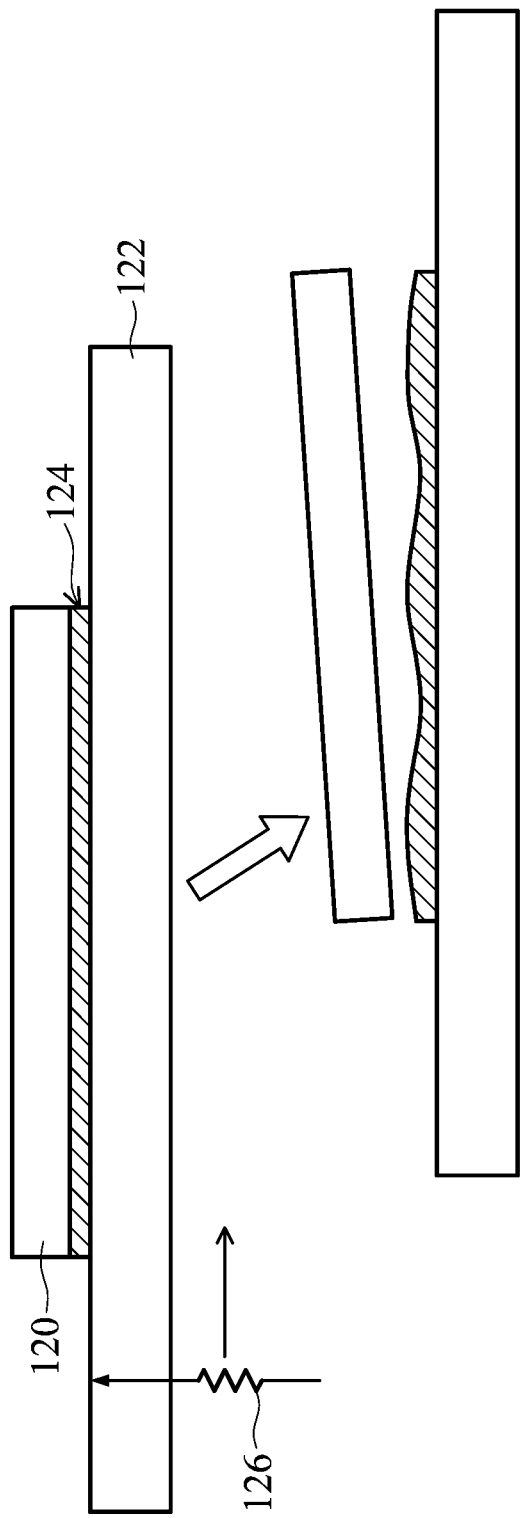

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the invention.

Figure 2A:
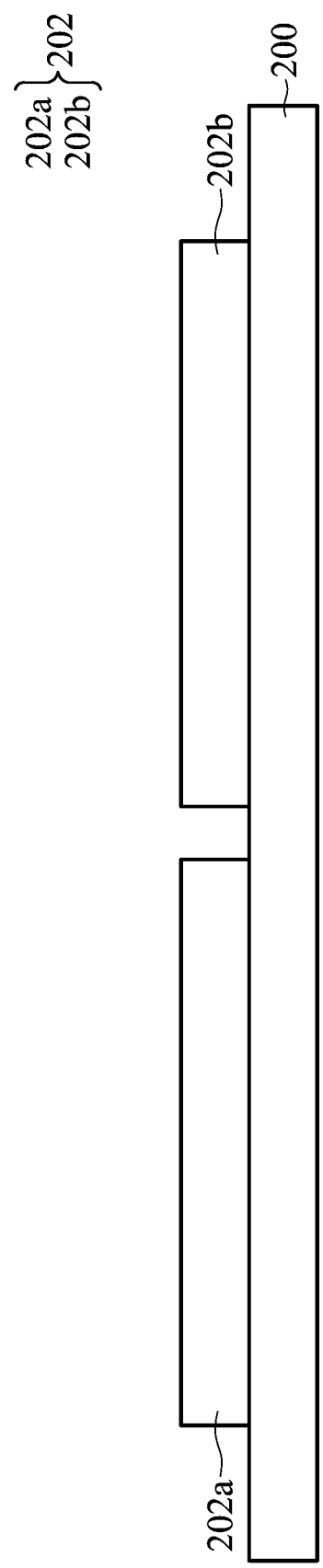
FIGS. 2a to 2j are cross sections showing one exemplary embodiment of a flexible electronic device of the invention.

FIGS. 2a to 2j are cross sections showing one exemplary embodiment of a flexible electronic device 500a of the invention. One exemplary embodiment of a flexible electronic device may comprise a flexible electronic display, a flexible electronic touch panel, a flexible solar cell or a flexible electronic sensor. As shown in FIG. 2a, a carrier substrate 200 is provided. In one embodiment, the carrier substrate 200 may comprise a hard substrate such as a glass substrate, a silicon substrate, a quartz substrate or a sapphire substrate. The hard substrate maintains an original shape without distortion even when moved or carried. Next, a plurality of release layers 202 are formed on the carrier substrate 200, separated from each other by a formation method comprising vacuum evaporation or screen printing (two release layers 202a and 202b are shown for brevity). The number of release layers is not limited herein but dependant upon the number of the sequence of flexible electronic devices. Also, a single release layer may be formed. The release layers 202 allow the subsequently formed flexible electronic devices on the carrier substrate 200 to be separated from the carrier substrate easily. The separation method is described in the following description. In one embodiment, the release layers 202 may comprise parylene. For example, the release layers 202 may comprise RICHMOND PRODUCTS INC. release layer A5000, VAC-PAK A6200, E3760, VAC-PAK E4760 or E2760.

Figure 2B:
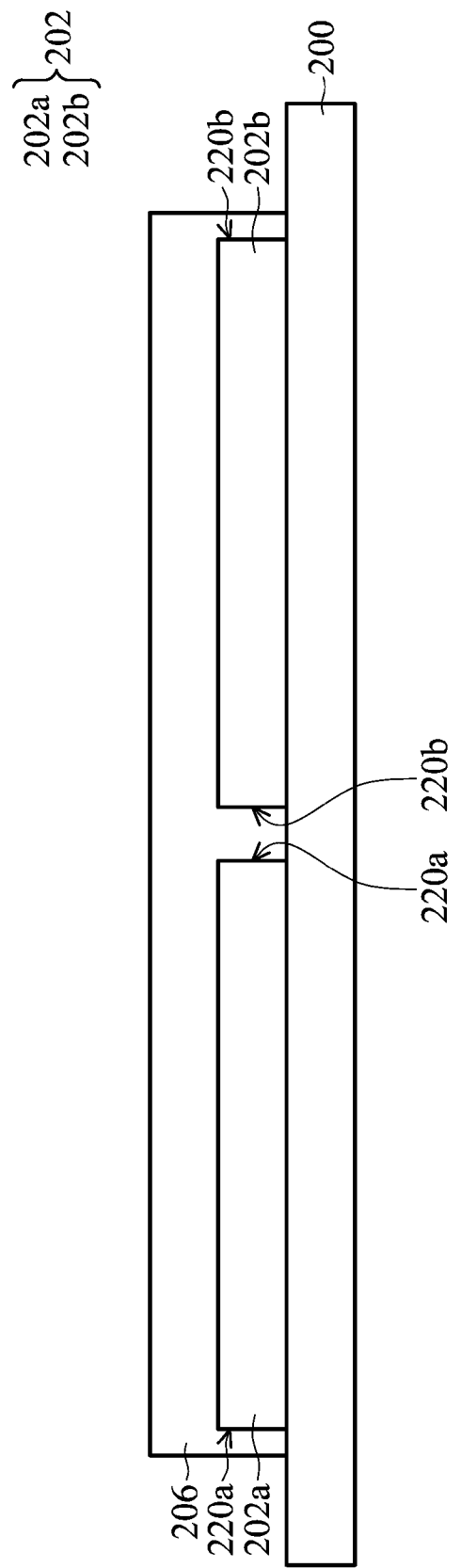

Next, referring to FIG. 2b, an adhesion layer 206 is formed on a portion of the carrier substrate 200 by a formation method comprising screen printing, spatula printing, roller coating, spray printing or spin coating. As shown in FIG. 2b, the adhesion layer 206 covers the release layers 202a and 202b and sidewalls 220a and 220b of the release layers 202a and 202b, wherein an area of the adhesion layer 206 is larger than a total area of the release layers 202a and 202b. In one embodiment, the adhesion layer 206 may comprise a material that is easily gasified by a laser beam or a material with a high adhesion force. For example, in one embodiment, the adhesion layer 206 may comprise 3-(Triethoxysilyl)-1-propanamine), epoxy resin, UV-curing resin, silicon resin or the like. In one embodiment, the adhesion layer 206 is used to bond the carrier substrate 200 to the subsequent flexible electronic device formed on the carrier substrate 200.

Figure 2C:
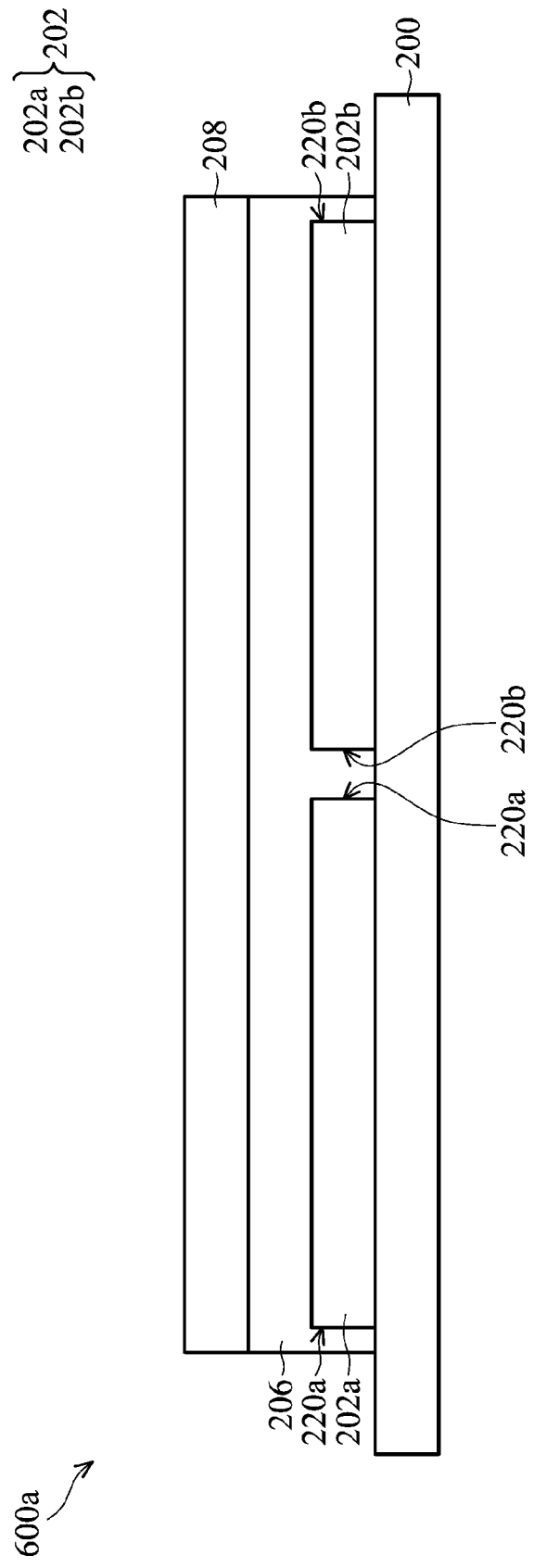

Next, referring to FIG. 2c, a flexible substrate 208 is formed on the release layers 202a and 202b and the adhesion layer 206 by a formation method comprising screen printing, spatula printing, roller coating, spray printing, spin coating or slot die coating. Alternatively, a fabricated flexible substrate 208 may be used to bond onto the carrier substrate 200 via an adhesion layer 206. As shown in FIG. 2c, the flexible substrate 208 covers the adhesion layer 206, and the bottom of the flexible substrate 208 is connected to the top of the adhesion layer 206. In one embodiment, the flexible substrate 208 may comprise a transparent polymer, for example, polyimide or other plastics. Additionally, in one embodiment, an adhesion force between the adhesion layer 206 and the flexible substrate 208 is larger than that between the carrier substrate 200 and the flexible substrate 208. Thus, a transferring apparatus 600a for a flexible electronic device is completely formed. The transferring apparatus 600a is a structure formed during an intermediate process of forming a flexible electronic device. The transferring apparatus 600a comprises the carrier substrate 200, the release layer 202 formed on the carrier substrate 200, and the adhesion layer 206 formed between a portion of the carrier substrate 200 and the flexible substrate 208, covering the release layer 202. The transferring apparatus 600a is used to allow the flexible substrate to be easily separated from the carrier substrate during a subsequent debonding step.

Figure 2D:
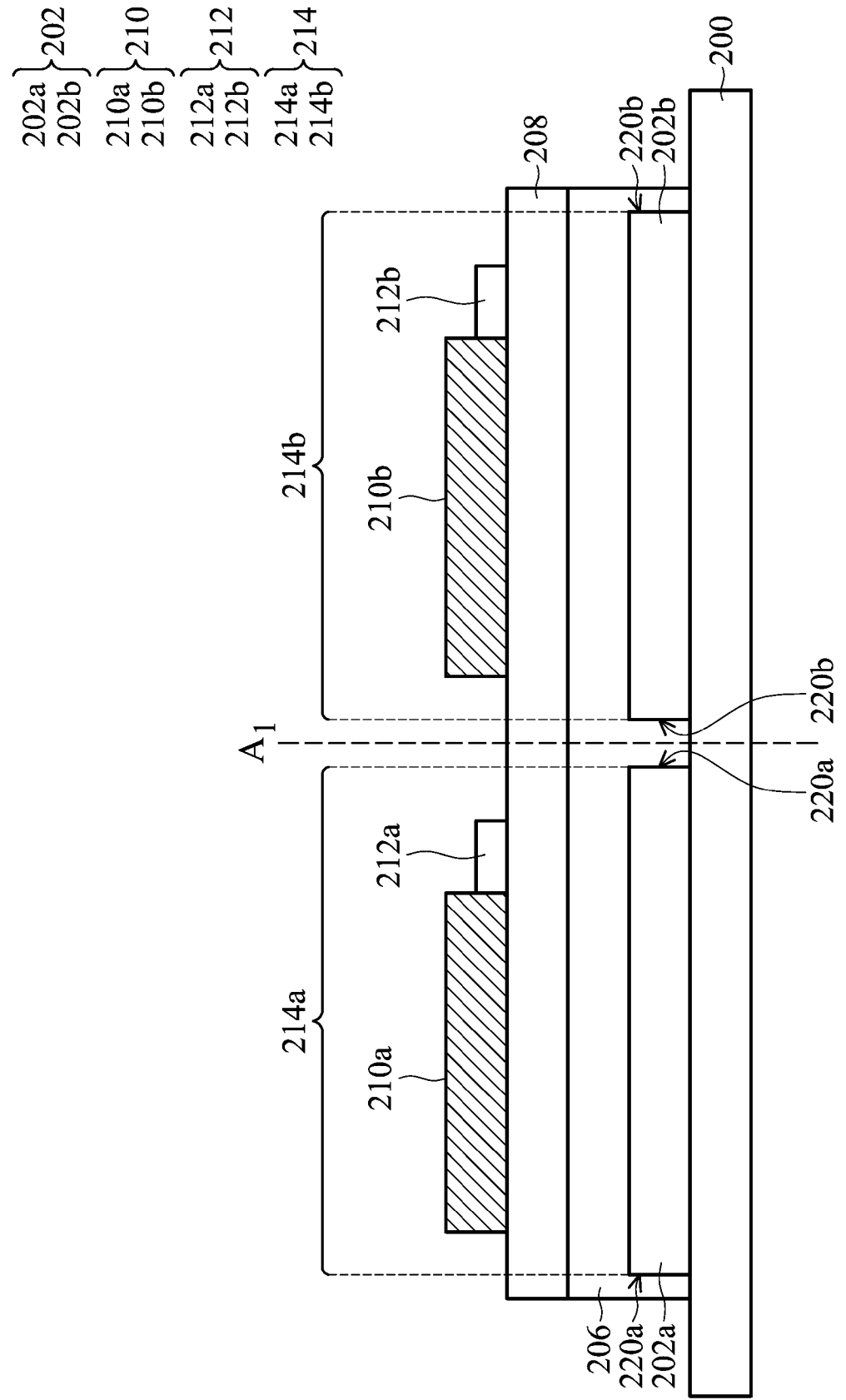

Next, referring to FIG. 2d, a plurality of flexible electronic components 210 separated from each other are formed in device forming regions 214a and 214b of the flexible substrate 208 by a semiconductor process (two flexible electronic components 210a and 210b are shown for brevity). The number of flexible electronic components is not limited herein but dependant upon design. Also, a single flexible electronic component may be formed. The flexible electronic components 210a and 210b are separated by a scribe line $A_1$. In one embodiment, the flexible electronic components 210 may comprise electronic components comprising thin film transistors (TFT) or solar devices. As shown in FIG. 2d, the device forming regions 214 are substantially directly on the release layers 202, so that the device forming regions 214 has a projection region located inside the release layers 202. Therefore, the flexible electronic components 210 may have a projection region located inside the release layers 202. For example, as shown in FIG. 2d, the flexible electronic components 210a and 210b have projection regions located inside the release layers 202a and 202b, respectively. Additionally, the scribe line $A_1$ is positioned in a region between the device forming regions 214a and 214b. Next, conductive lines 212a and 212b are formed on the flexible substrate 208 by a semiconductor process. The conductive lines 212a and 212b are electrically connected to the flexible electronic components 210a and 210b to provide input/output (IO) electrical connecting paths of the flexible electronic components 210a and 210b.

Figure 2E:
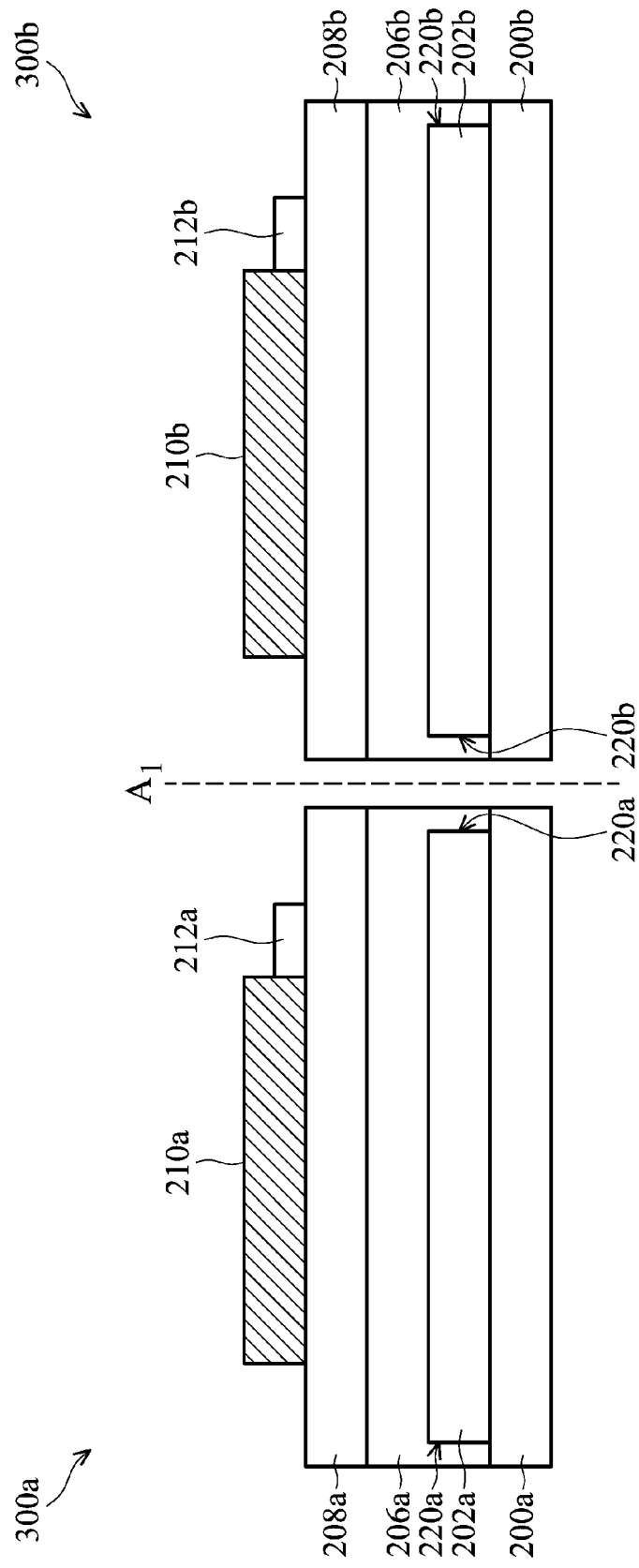

Next, referring to FIG. 2e, a pre-cutting step is performed to cut the flexible substrate 208, the adhesion layer 206 and the carrier substrate 200, which are between any two adjacent flexible electronic components 210a and 210b and any two adjacent release layers 202a and 202b, in sequence along the normal line of the carrier substrate 200, thereby separating the flexible substrate 208, the adhesion layer 206 and the carrier substrate 200 into independent flexible electronic device quasi-structures 300a and 300b with a larger area. Each of the flexible electronic device quasi-structures 300a or 300b is a structure having a single flexible electronic component 210a or 210b, so that processes of bonding a flexible printed circuit board (FPC) and debonding the flexible substrate can be performed. As shown in FIG. 2e, the flexible electronic device quasi-structure 300a comprises a carrier substrate 200a, a release layer 202a, the adhesion layer 206a, the flexible substrate 208a, the single flexible electronic component 210a and the conductive line 212a. Similarly, the flexible electronic device quasi-structure 300b comprises a carrier substrate 200b, a release layer 202b, the adhesion layer 206b, the flexible substrate 208b, the single flexible electronic component 210b and the conductive line 212b. It is noted that the flexible substrate 208 is connected to the carrier substrate 200 via an adhesion layer 206, and the adhesion force between the adhesion layer 206 and the flexible substrate 208 is larger than that between the carrier substrate 200 and the flexible substrate 208. Therefore, when performing the pre-cutting step, a peeling problem on an interface between the flexible substrate and the carrier substrate of the conventional flexible electronic device does not occur.

Figure 2F:
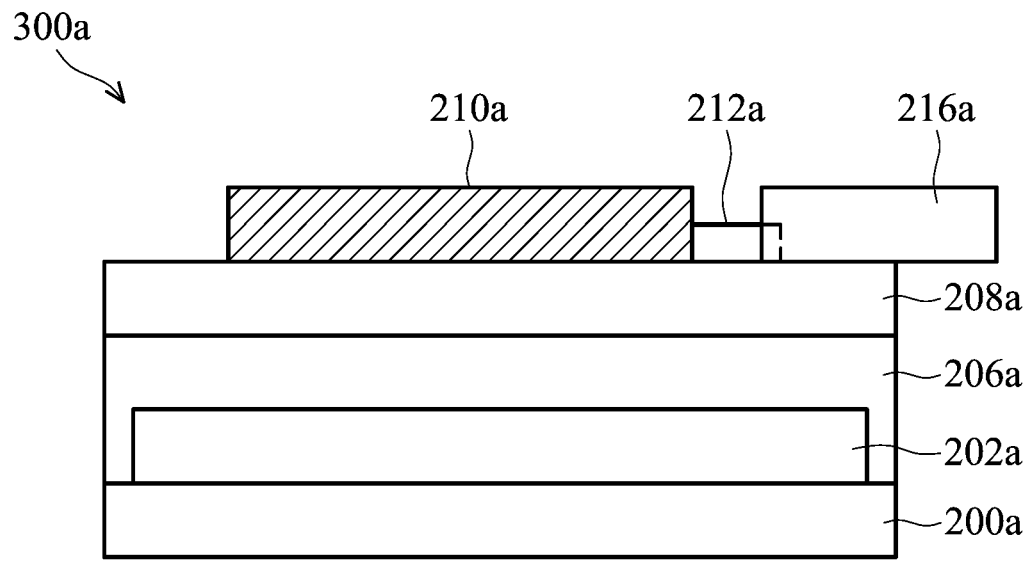

Next, referring to FIG. 2f, a flexible printed circuit board (FPC) 216a is disposed on the flexible electronic device quasi-structure 300a by a bonding process (only one flexible electronic device quasi-structure 300a is shown for brevity.), electrically connected to the flexible electronic component 210a through the conductive line 212a so that the flexible electronic component 210a can couple to other electronic devices.

Figure 2G:
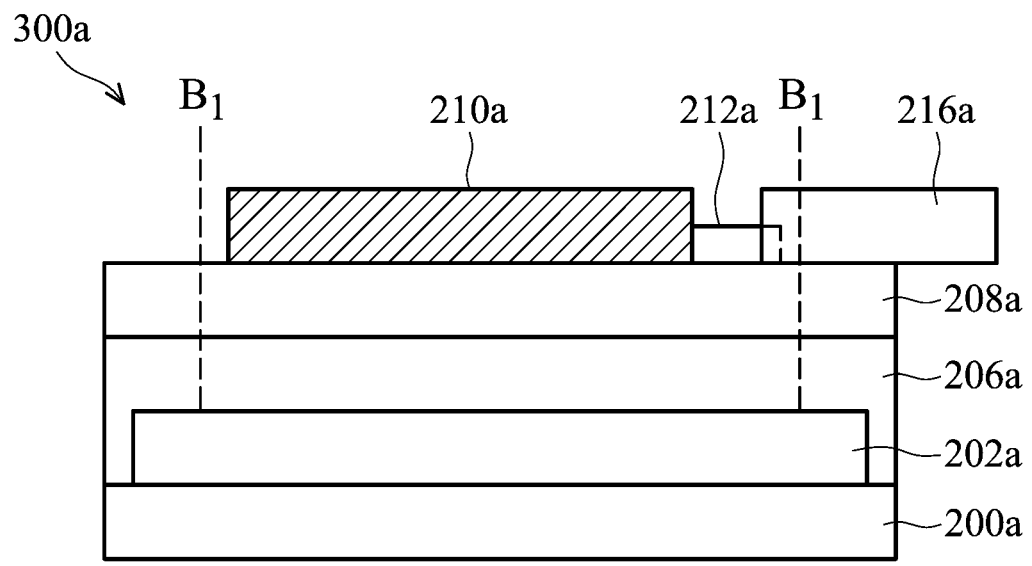
Figure 2H:
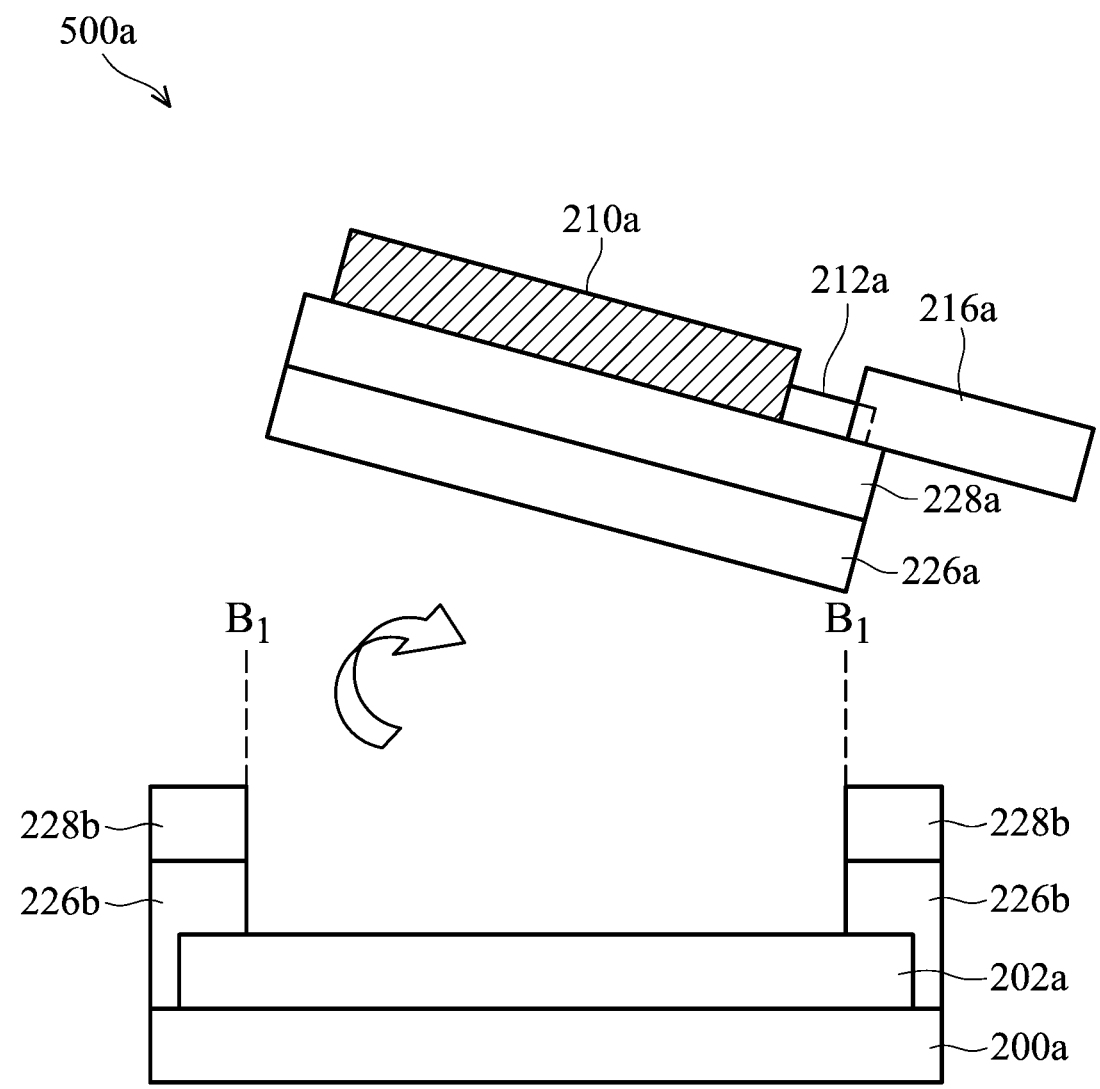

Next, referring to FIG. 2g, a separating step may be performed using a cutting tool to cut the flexible substrate 208a outside of the flexible electronic component 210a and the adhesion layer 206a covering the release layer 202a to the release layer 202a in sequence, along a scribe line $B_1$ on the normal line of the carrier substrate 200a, thereby allowing air to enter into an interface between the adhesion layer 206a and the release layer 202a or an interface between the release layer 202a and the carrier substrate 200a. In one embodiment, the scribe line B₁ surrounds a subsequent flexible electronic device 500a as shown in FIG. 2h. Referring to FIG. 2h, a cut adhesion layer 226a is totally separated from the release layer 202a. Next, a debonding step is performed so that a cut flexible substrate 228a is separated from the carrier substrate 200a. Thus, the flexible electronic device 500a is completely formed. The flexible electronic device 500a is separated from the carrier substrate 200a from the release layer 202 of the transferring apparatus 600a. The adhesion force between the adhesion layer 206 and the flexible substrate 208 is larger than that between the carrier substrate 200 and the flexible substrate 208. Therefore, when performing the pre-cutting step, a peeling problem on an interface between the flexible substrate and the carrier substrate of the conventional flexible electronic device does not occur.

Figure 2I:
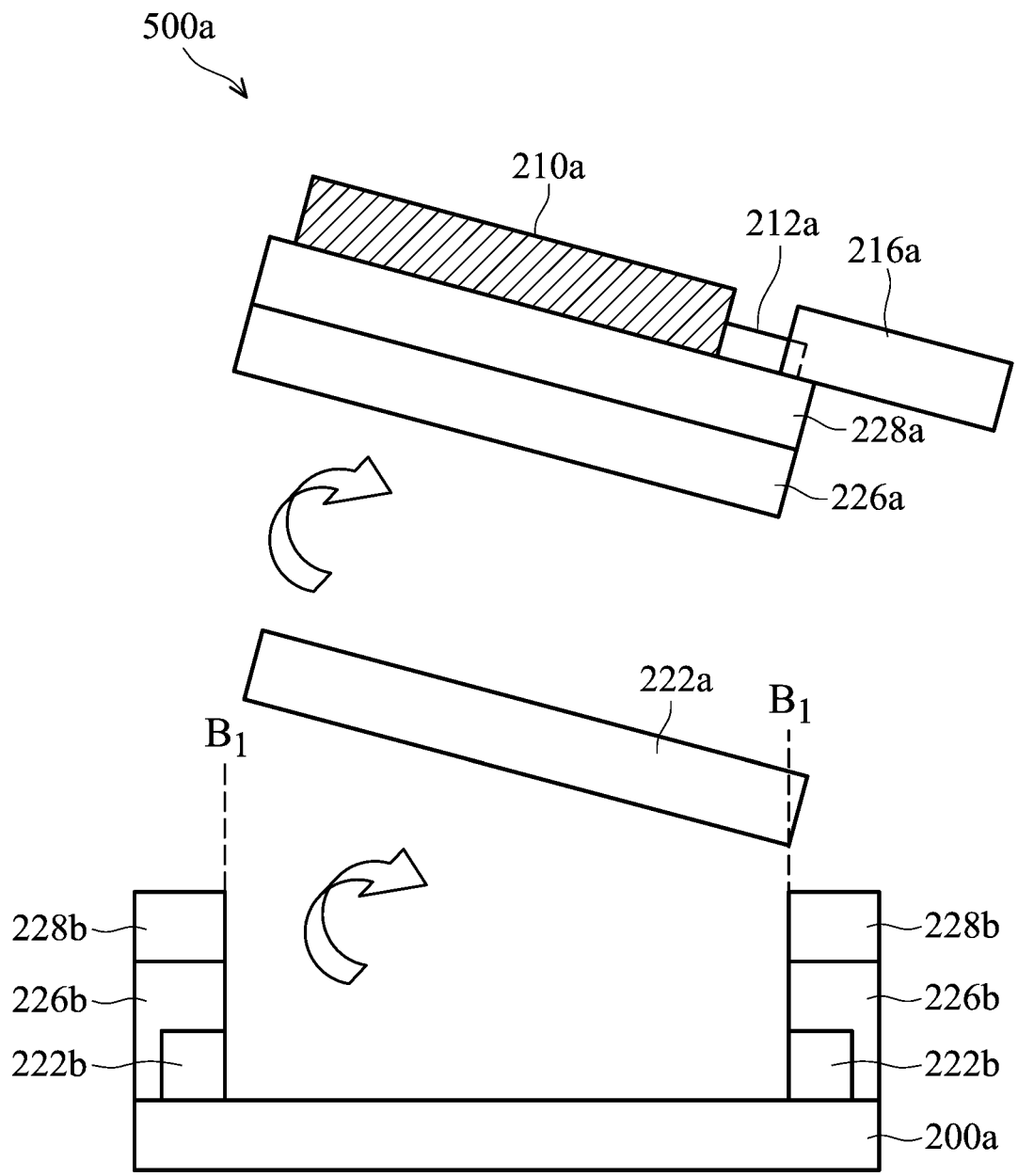
Figure 2J:
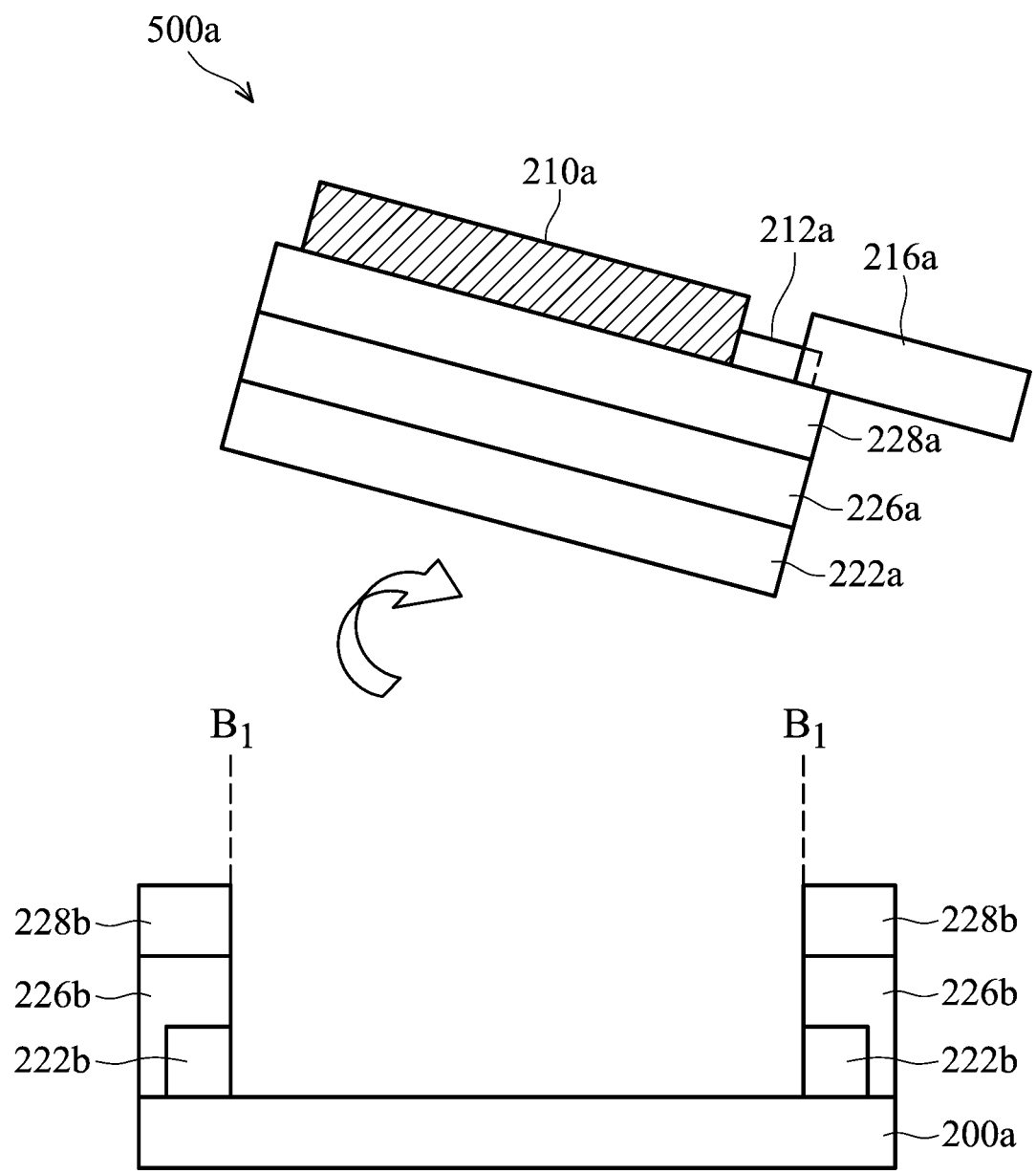

Additionally, material selection of the release layer depends on materials of the carrier substrate and the adhesion layer. Therefore, the adhesion force between the release layer and the carrier substrate may be changed. In embodiments as shown in FIG. 2h, when the flexible substrate 228a is separated from the carrier substrate 200a, the release layer 202a and the carrier substrate 200a are bonded together. Alternatively, as shown in FIG. 2i, when the flexible substrate 228a is separated from the carrier substrate 200a during the debonding step, the cut release layer 222a may be separated from the carrier substrate 200a. Further, as shown in FIG. 2j, when the flexible substrate 228a is separated from the carrier substrate 200a during the debonding step, the cut release layer 222a and the flexible substrate 228a are bonded together, and a remaining release layer 222b is on the carrier substrate 200a.

Figure 3A:
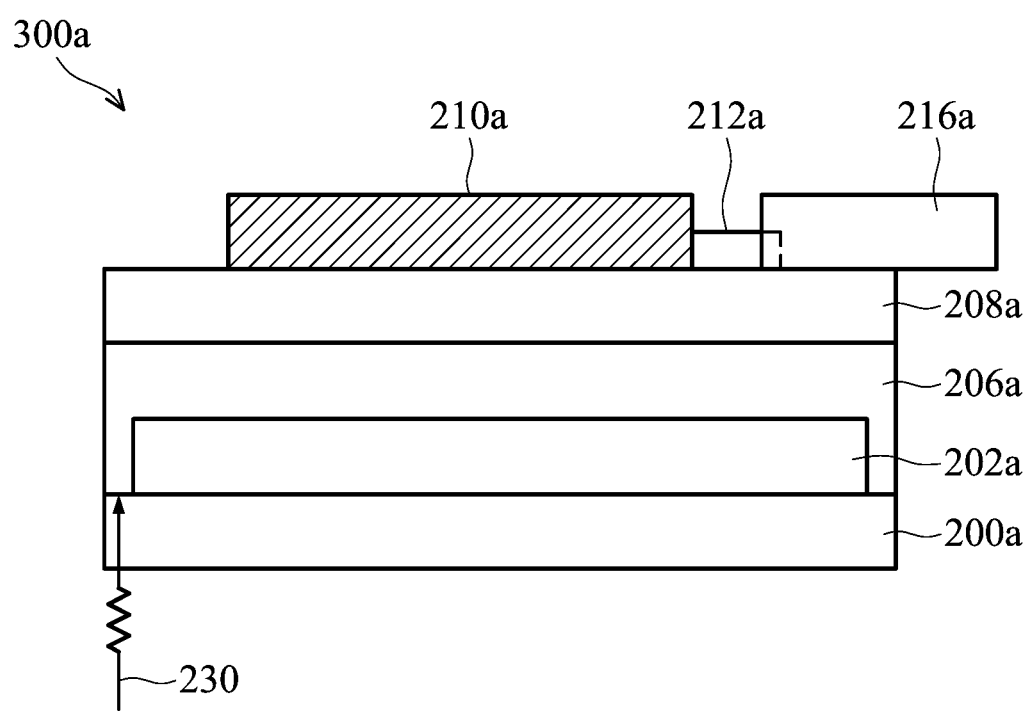
FIGS. 3a to 3d are cross sections showing another exemplary embodiment of a flexible electronic device of the invention, showing another debonding step of a flexible substrate separated from a carrier substrate.

FIGS. 3a to 3d are cross sections showing another exemplary embodiment of a flexible electronic device 500b of the invention, showing another debonding step of a flexible substrate separated from a carrier substrate. Elements of the embodiments hereinafter, that are the same or similar as those previously described with reference to FIGS. 2a to 2j, are not repeated for brevity. As shown in FIG. 3a, a separating step may be performed using a laser beam 230 to scan a portion of the adhesion layer 206a adjacent to an interface between the release layer 202a and the adhesion layer 206a, thereby gasifying the adhesion layer 206a, allowing air to enter into an interface between the adhesion layer 206a and the release layer 202a or an interface between the release layer 202a and the carrier substrate 200a.

Figure 3B:
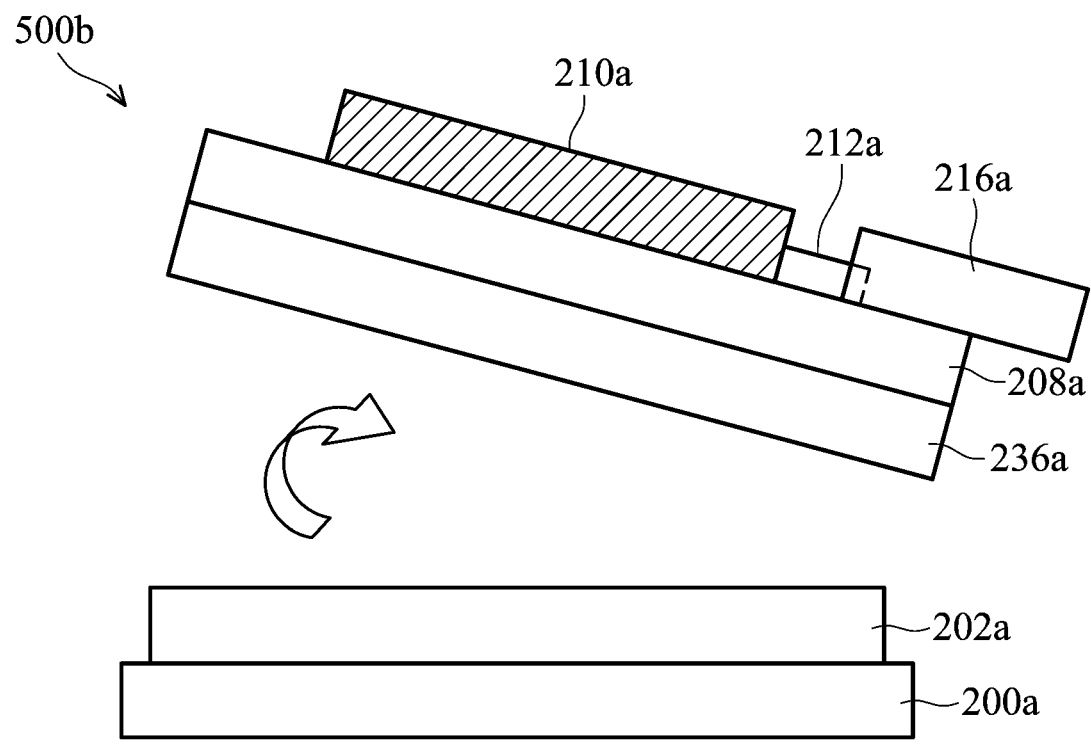

Referring to FIG. 3b, the gasified adhesion layer 206a is separated from the release layer 202a after performing the separating step. Next, a debonding step is performed so that the flexible substrate 208a is separated from the carrier substrate 200a. Thus, the flexible electronic device 500b comprising the flexible substrate 208a and the flexible electronic component 210a thereon is completely formed. The separating and debonding steps using the laser beam to gasify the adhesion layer can eliminate the slow throughput problem due to a large laser scanning area of the conventional large-sized flexible electronic devices and the low yield problem due to laser beams passing thorough the flexible substrate and destroying the flexible electronic component thereon of the conventional flexible electronic devices.

Figure 3C:
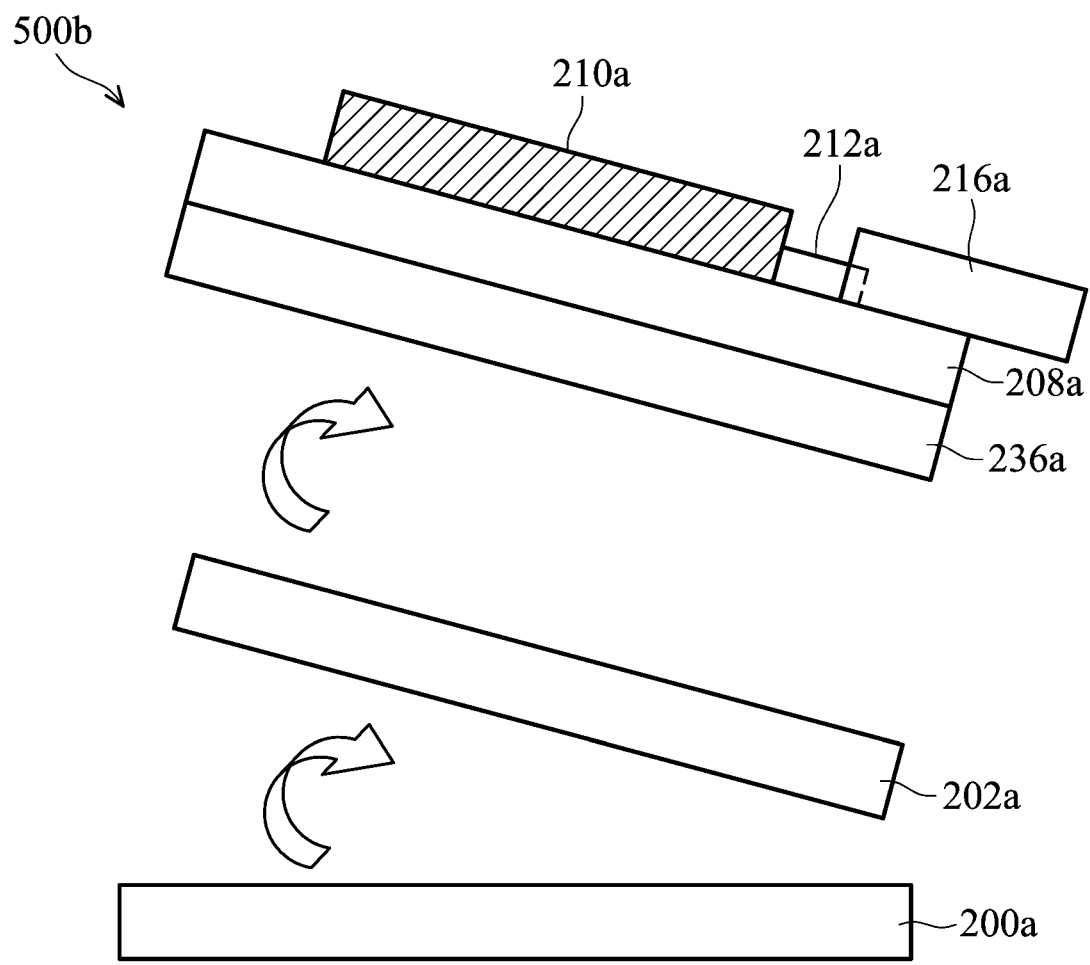
Figure 3D:
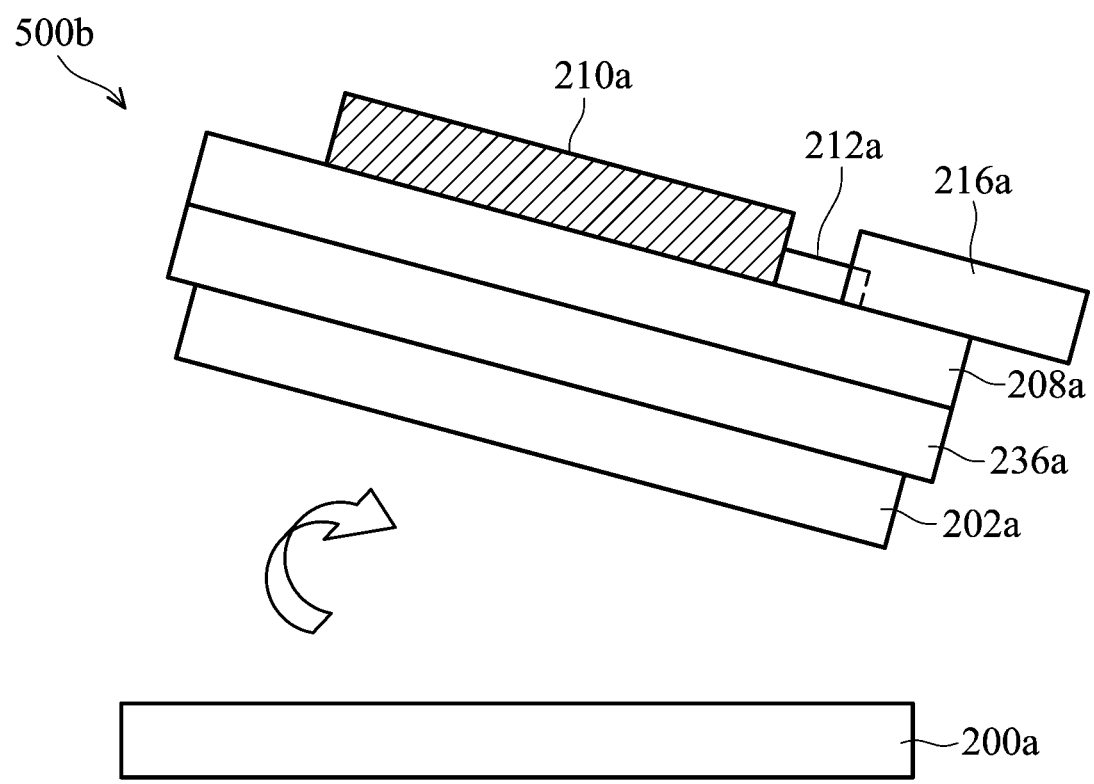

In embodiment as shown in FIG. 3b, when the flexible substrate 208a is separated from the carrier substrate 200a, the release layer 202a and the carrier substrate 200a are bonded together. Alternatively, as shown in FIG. 3c, when the flexible substrate 208a is separated from the carrier substrate 200a during the debonding step, the release layer 202a may be separated from the carrier substrate 200a. Further, as shown in FIG. 3d, when the flexible substrate 208a is separated from the carrier substrate 200a during the debonding step, the release layer 202a and the flexible substrate 208a are bonded together via an adhesion layer 236a.

Figure 4A:
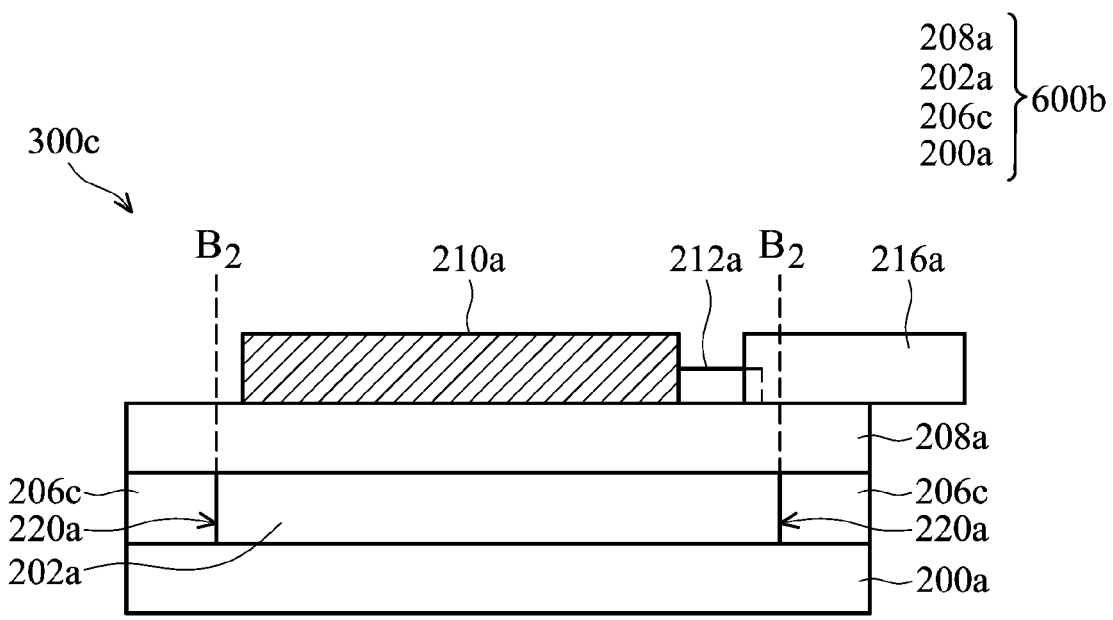
FIGS. 4a to 4d are cross sections showing yet another exemplary embodiment of a flexible electronic device of the invention, showing a debonding step of a flexible substrate separated from a carrier substrate, wherein the adhesion layer surrounds the release layer and is adjacent to a sidewall of the release layer.

FIGS. 4a to 4d are cross sections showing yet another exemplary embodiment of a flexible electronic device 500c of the invention, showing another transferring apparatus for a flexible electronic device 600b. As shown in FIG. 4a, in the transferring apparatus for a flexible electronic device 600b, an adhesion layer 206c surrounds the release layer 202a, adjacent to the sidewalls 220a and 220b of the release layer 202a. The flexible substrate 208a is disposed on the adhesion layer 206c and release layer 202a, connecting to the adhesion layer 206c and release layer 202a. The carrier substrate 200a, the release layer 202a, adhesion layer 206c surrounding the release layer 202a and flexible substrate 208a on the adhesion layer 206c and release layer 202a are constructed as the transferring apparatus for a flexible electronic device 600b of the invention.

Figure 4B:
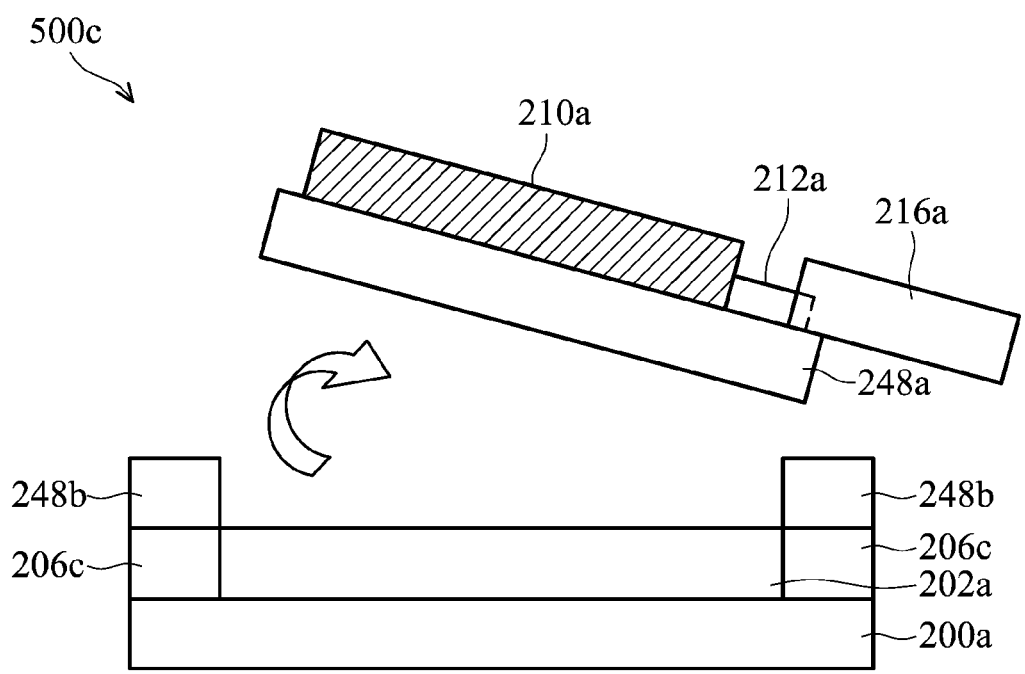

Next, referring to FIG. 4a again, a separating step may be performed using a cutting tool to cut the flexible substrate 208a outside of the flexible electronic component 210a and the adhesion layer 206a surrounding the release layer 202a up to the carrier substrate 200a of a flexible electronic device quasi-structure 300c in sequence along a scribe line B₂ on the normal line of the carrier substrate 200a, thereby allowing air to enter into an interface between the adhesion layer 206c and the release layer 202a or an interface between the release layer 202a and the carrier substrate 200a. In one embodiment, the scribe line B₂ surrounds a subsequent flexible electronic device 500c as shown in FIG. 4b. Referring to FIG. 4b, a cut flexible substrate 248a is totally separated from the release layer 202a after performing the separating step. Next, a debonding step is performed so that the cut flexible substrate 248a is separated from the carrier substrate 200a, and a remaining flexible substrate 248b and the adhesion layer 206c are bonded together. Thus, the flexible electronic device 500c comprising the flexible substrate 248a and the flexible electronic component 210a is completely formed.

Figure 4C:
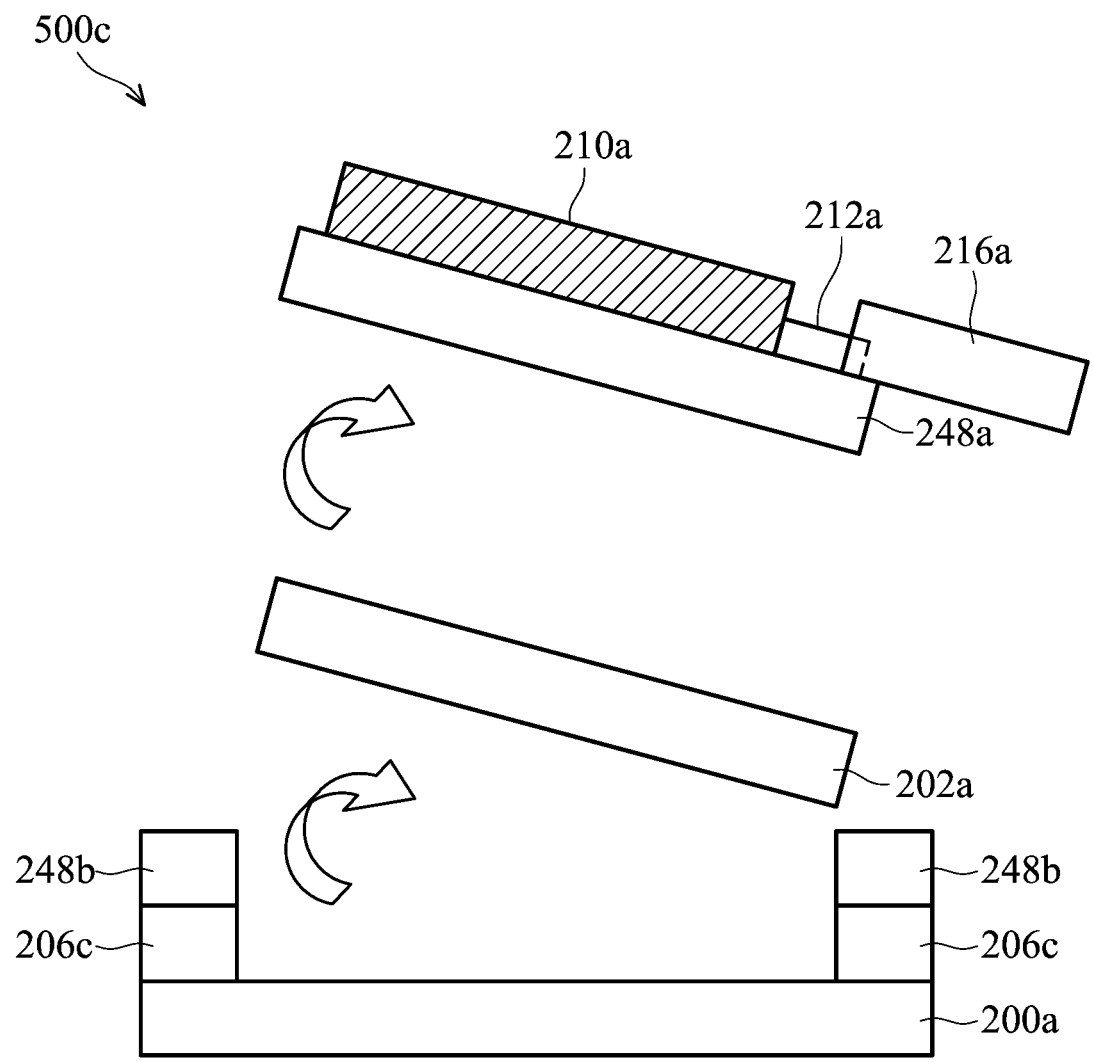
Figure 4D:
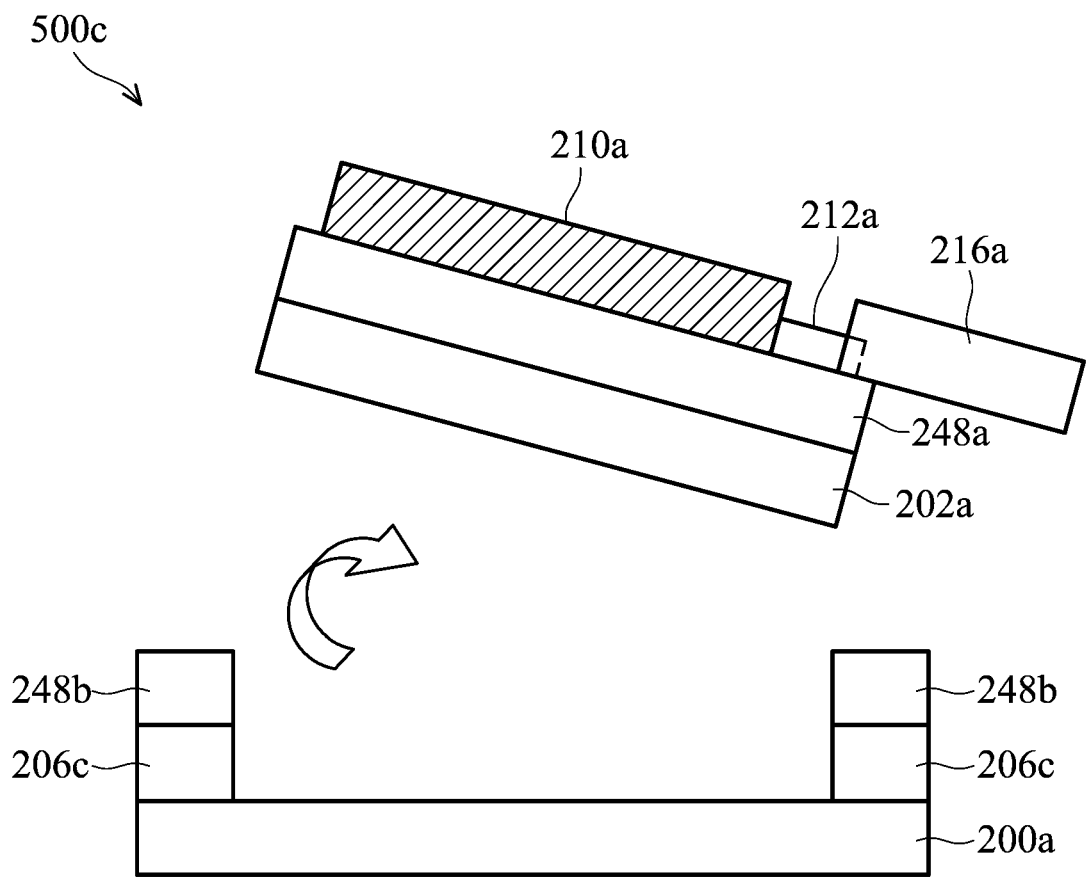

In an embodiment as shown in FIG. 4b, when the flexible substrate 248a is separated from the carrier substrate 200a, the release layer 202a and the carrier substrate 200a are bonded together. Alternatively, as shown in FIG. 4c, when the flexible substrate 248a is separated from the carrier substrate 200a during the debonding step, the release layer 202a may be separated from the carrier substrate 200a. Further, as shown in FIG. 4d, when the flexible substrate 248a is separated from the carrier substrate 200a during the debonding step, the release layer 202a and the flexible substrate 248a are bonded together.

Figure 5A:
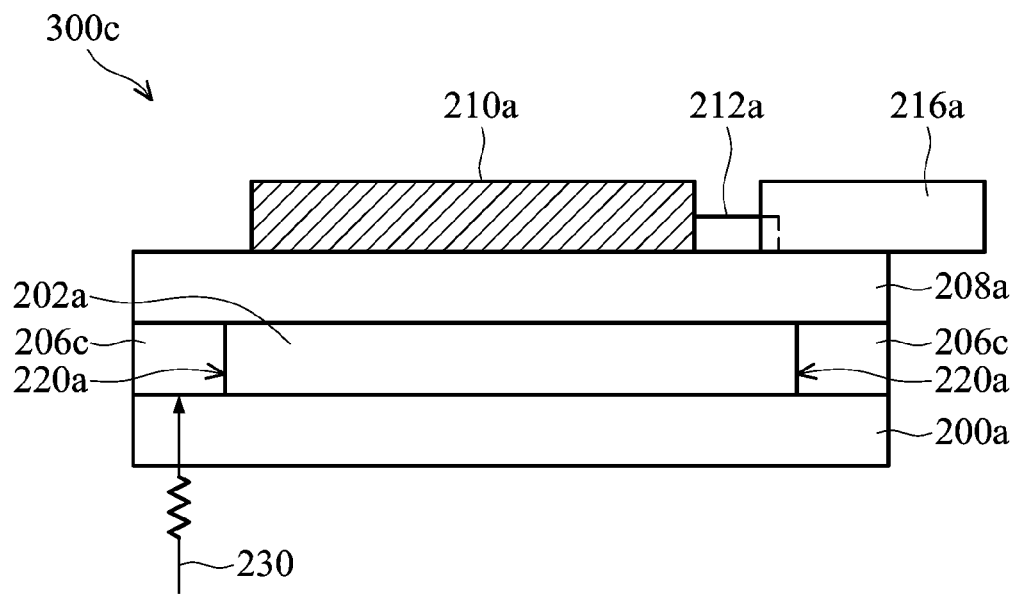
FIGS. 5a to 5d are cross sections showing yet another exemplary embodiment of a flexible electronic device of the invention, showing yet another debonding step of a flexible substrate separated from a carrier substrate.

FIGS. 5a to 5d are cross sections showing yet another exemplary embodiment of a flexible electronic device 500d of the invention, showing yet another debonding step of a flexible substrate separated from a carrier substrate. Elements of the embodiments hereinafter, that are the same or similar as those previously described with reference to FIGS. 2a to 2j, 3a to 3d and 4a to 4d, are not repeated for brevity. As shown in FIG. 5a, a separating step may be performed using a laser beam 230 to scan a portion of the adhesion layer 206c of the flexible electronic device quasi-structure 300c, wherein the adhesion layer 206c is adjacent to an interface between the release layer 202a and the adhesion layer 206c, thereby totally gasifying the adhesion layer 206c, allowing air to enter into an interface between the adhesion layer 206c and the release layer 202a or an interface between the release layer 202a and the carrier substrate 200a.

Figure 5B:
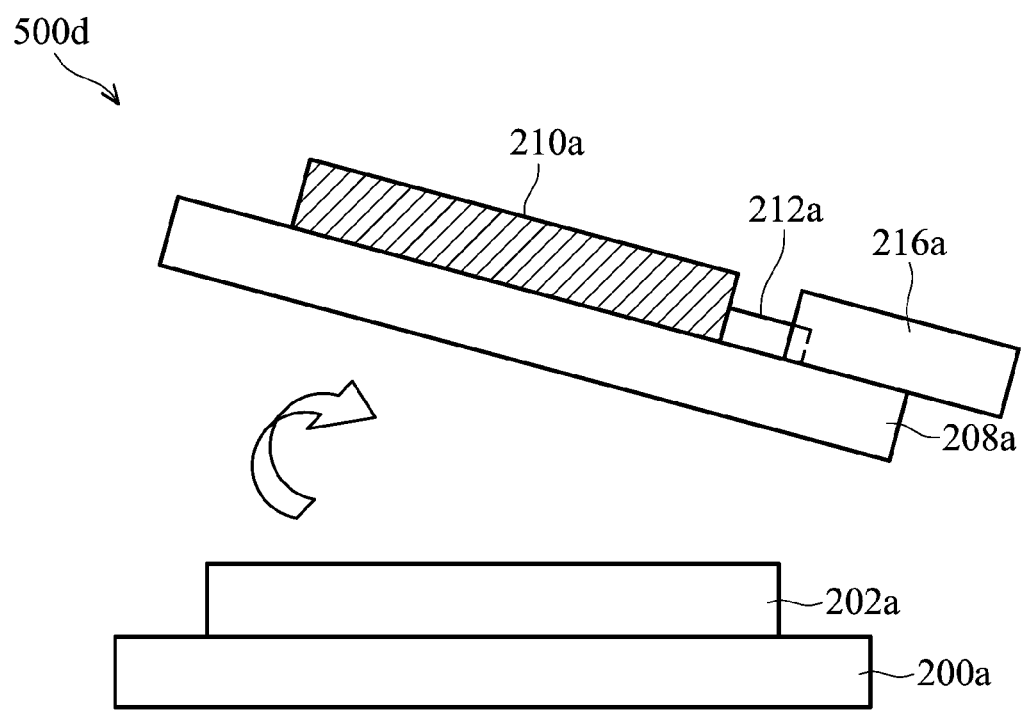

Referring to FIG. 5b, the flexible substrate 208a can be separated from the release layer 202a after performing the separating step. Next, a debonding step is performed so that the flexible substrate 208a is separated from the carrier substrate 200a. Thus, the flexible electronic device 500d comprising the flexible substrate 208a and the flexible electronic component 210a thereon is completely formed.

Figure 5C:
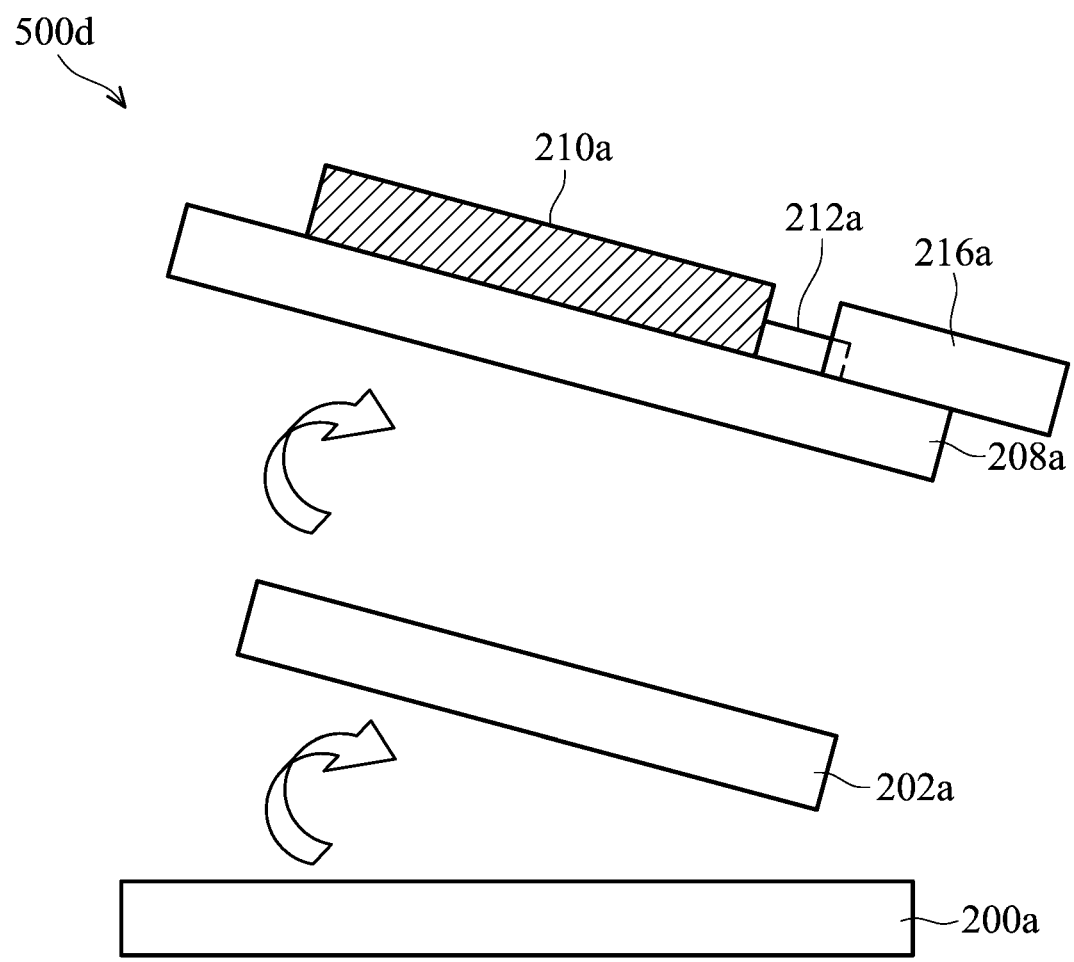
Figure 5D:
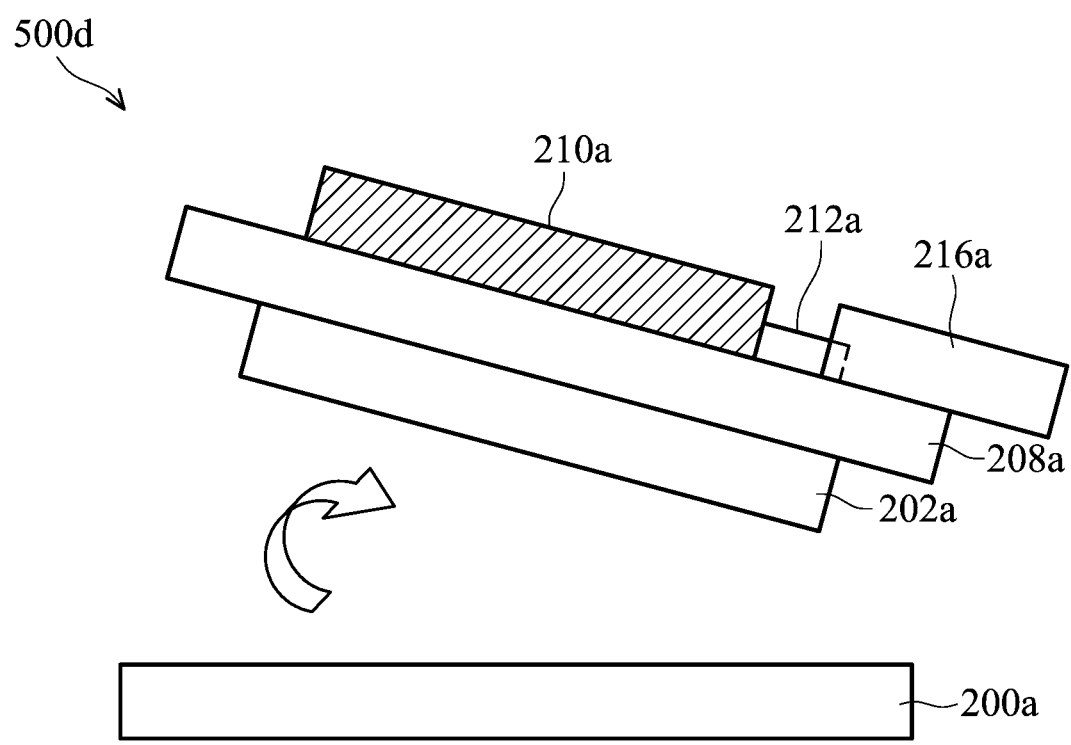

In embodiment as shown in FIG. 5b, when the flexible substrate 208a is separated from the carrier substrate 200a, the release layer 202a and the carrier substrate 200a are bonded together. Alternatively, as shown in FIG. 5c, when the flexible substrate 208a is separated from the carrier substrate 200a during the debonding step, the release layer 202a may be separated from the carrier substrate 200a. Further, as shown in FIG. 5d, when the flexible substrate 208a is separated from the carrier substrate 200a during the debonding step, the release layer 202a and the flexible substrate 208a are bonded together.

The flexible electronic devices 500a to 500c are separated from the carrier substrate 200 from the release layer 202 of the transferring apparatus for a flexible electronic device 600a or 600b. The flexible electronic device 600a or 600b having an adhesion force between the adhesion layer 206 and the flexible substrate 208 is larger than that between the carrier substrate 200 and the flexible substrate 208. Therefore, when performing the pre-cutting step, a peeling problem on an interface between the flexible substrate and the carrier substrate of the conventional flexible electronic device does not occur. The flexible electronic devices 500a to 500c have improved process stability and process yield. Also, the additional fabrication cost for the debonding step can be reduced. Further, the separating and debonding steps using the laser beam to gasify the adhesion layer can eliminate the slow throughput problem due to a huge laser scanning area of the conventional large-sized flexible electronic devices and the low yield problem due to laser beams passing thorough the flexible substrate and destroying the flexible electronic component thereon of the conventional flexible electronic devices. Moreover, one exemplary embodiment of transferring apparatus for a flexible electronic device and method for fabricating a flexible electronic device of the invention can be applied in any flexible electronic device comprising a flexible electronic display, a flexible electronic touch panel, a flexible solar cell, a flexible electronic sensor or other suitable electronic devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus, comprising:
   a carrier substrate;
   a first release layer disposed on the carrier substrate;
   an adhesion layer disposed on a portion of the carrier substrate, surrounding the first release layer and adjacent to a sidewall of the first release layer; and
   a flexible electronic device disposed on the adhesion layer, wherein the flexible electronic device comprises:
      a flexible substrate connecting to the adhesion layer; and
      a first flexible electronic component on the flexible substrate, wherein the first flexible electronic component is held apart from the adhesion layer and the first release layer by the flexible substrate, and wherein the first flexible electronic component is formed entirely within a first device forming region of the flexible substrate, the first device forming region being formed directly over the first release layer such that a projection region of the first device forming region is located inside the first release layer, wherein the adhesion layer is a single-layered element, and wherein the adhesion layer covers a top surface of the first release layer so as to be between the first release layer and the flexible substrate.

2. The apparatus as claimed in claim 1, wherein an area of the adhesion layer is larger than that of the first release layer.

3. The apparatus as claimed in claim 1, wherein an adhesion force between the adhesion layer and the flexible substrate is larger than that between the carrier substrate and the flexible substrate.

4. The apparatus as claimed in claim 1, wherein the flexible substrate covers the adhesion layer.

5. The apparatus as claimed in claim 1, wherein the carrier substrate comprises a glass substrate, a silicon substrate, a quartz substrate or a sapphire substrate.

6. The apparatus as claimed in claim 1, wherein the first release layer comprises parylene.

7. The apparatus as claimed in claim 1, wherein the adhesion layer comprises 3-(Triethoxysilyl)-1-propanamine, epoxy resin, UV-curing resin or silicon resin.

8. The apparatus as claimed in claim 1, further comprising:
   a second release layer formed on the carrier substrate, wherein the adhesion layer separates the first and second release layers; and
   a second flexible electronic component on the flexible substrate, wherein the second flexible electronic component is formed entirely within a second device forming region of the flexible substrate, the second device forming region being formed directly over the second release layer such that a projection region of the second device forming region is located inside the second release layer.

9. The apparatus as claimed in claim 1, wherein the flexible electronic device comprises a flexible electronic display, a flexible electronic touch panel, a flexible solar cell or a flexible electronic sensor.

10. A method for fabricating a flexible electronic device, comprising:
   providing a carrier substrate;
   forming a first release layer disposed on the carrier substrate;
   forming an adhesion layer disposed on a portion of the carrier substrate, surrounding the first release layer and adjacent to a sidewall of the first release layer;
   forming a flexible electronic device disposed on the adhesion layer, wherein the step of forming the flexible electronic device comprises:
      forming a flexible substrate connecting to the adhesion layer; and
      forming a flexible electronic component on the flexible substrate, wherein the flexible electronic component is held apart from the adhesion layer and the first release layer by the flexible substrate, and wherein the flexible electronic component is formed entirely within the device forming region of the flexible substrate, the device forming region being formed directly over the first release layer such that a projection region of the device forming region is located inside the first release layer, wherein the adhesion layer is a single-layered element, and wherein the adhesion layer covers a top surface of the first release layer so as to be between the first release layer and the flexible substrate; and
   performing a debonding step so that the flexible substrate is separated from the carrier substrate.

11. The method for fabricated a flexible electronic device as claimed in claim 10, further comprising:
    performing a separating step, thereby allowing air to enter into an interface between the adhesion layer and the first release layer or an interface between the first release layer and the carrier substrate before performing the debonding step.

12. The method for fabricating a flexible electronic device as claimed in claim 11, wherein the separating step comprises using a cutting tool to cut the flexible substrate from the outside of the flexible electronic component, the adhesion layer surrounding the first release layer and the carrier substrate in sequence along the normal line of the carrier substrate.

13. The method for fabricating a flexible electronic device as claimed in claim 11, wherein the separating step comprises using a laser beam to scan a portion of the adhesion layer adjacent to an interface between the first release layer and the adhesion layer, thereby gasifying the adhesion layer.

14. The method for fabricating a flexible electronic device as claimed in claim 10, wherein the first release layer is formed by vacuum evaporation or screen printing.

15. The method for fabricating a flexible electronic device as claimed in claim 10, wherein the adhesion layer is formed by screen printing, spatula printing, roller coating, spray printing or spin coating.

16. The method for fabricating a flexible electronic device as claimed in claim 10, wherein an adhesion force between the adhesion layer and the flexible substrate is larger than that between the carrier substrate and the flexible substrate.

17. The method for fabricating a flexible electronic device as claimed in claim 10, wherein the flexible substrate is formed by screen printing, spatula printing, roller coating, spray printing, spin coating or slot die coating.

18. The method for fabricating a flexible electronic device as claimed in claim 10, wherein the formation of the flexible substrate comprises a fabricated substrate disposed on the carrier substrate via an adhesion layer.

19. The method for fabricating a flexible electronic device as claimed in claim 10, further comprising forming a second release layer on the carrier substrate, wherein the adhesion layer separates the first and second release layers.

20. The method for fabricating a flexible electronic device as claimed in claim 19, further comprising:
    forming a second flexible electronic component on the flexible substrate, wherein the second flexible electronic component is formed entirely within a second device forming region of the flexible substrate, the second device forming region being formed directly over the second release layer such that a projection region of the second device forming region is located inside the second release layer before performing the debonding step.

21. The method for fabricating a flexible electronic device as claimed in claim 20, further comprising:
    performing a pre-cutting step to cut the flexible substrate, the adhesion layer and the carrier substrate, between the first and second release layers, in sequence along the normal line of the carrier substrate after forming the first and second flexible electronic components separated from each other on the flexible substrate.

22. The method for fabricating a flexible electronic device as claimed in claim 10, wherein the flexible substrate is separated from the carrier substrate, and the first release layer is separated from the carrier substrate.

23. The method for fabricating a flexible electronic device as claimed in claim 10, wherein the flexible substrate is separated from the carrier substrate, and the first release layer and the carrier substrate are bonded together.

24. The method for fabricating a flexible electronic device as claimed in claim 10, wherein the flexible substrate is separated from the carrier substrate, and the first release layer and the flexible substrate are bonded together.

* * * * *